United States Patent
Ogawa et al.

(10) Patent No.: US 7,567,189 B2
(45) Date of Patent: Jul. 28, 2009

(54) VARIABLE LENGTH CODE DECODING APPARATUS AND VARIABLE LENGTH CODE DECODING METHOD

(75) Inventors: Takaya Ogawa, Kawasaki (JP);
Masashi Jobashi, Kawasaki (JP);
Kiwamu Watanabe, Kawasaki (JP);
Tatsuhiro Suzumura, Kawasaki (JP);
Satoshi Takekawa, Kawasaki (JP);
Hiromitsu Nakayama, Kawasaki (JP);
Yoshinori Shigeta, Kawasaki (JP);
Akihiro Oue, Palo Alto, CA (US); Shuji Michinaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/027,637

(22) Filed: Feb. 7, 2008

(65) Prior Publication Data

US 2008/0198046 A1 Aug. 21, 2008

(30) Foreign Application Priority Data

Feb. 8, 2007 (JP) ............................. 2007-029379

(51) Int. Cl.
*H03M 7/40* (2006.01)
(52) U.S. Cl. .......................................... 341/67; 341/63
(58) Field of Classification Search .................. 341/51, 341/63, 65, 67, 107
See application file for complete search history.

(56) References Cited

U.S. PATENT DOCUMENTS 5,173,695 A   12/1992  Sun et al.
5,412,611 A *  5/1995  Hattori et al. ................ 365/221
5,572,208 A * 11/1996  Wu .............................. 341/67

(Continued)

FOREIGN PATENT DOCUMENTS

JP   8-205142   8/1996

*Primary Examiner*—Brian Young
(74) *Attorney, Agent, or Firm*—Oblon, Spivak, McClelland, Maier & Neustadt, P.C.

(57) ABSTRACT

When a combination between a plurality of FIFO memories and a variable length coding table is used, a load generated by an increase in number of FIFO memories serving as output destinations of a codeword length output from the variable length coding table when the codeword length is output is reduced. A variable length code decoding apparatus includes an input unit which receives variable length coding data, a plurality of FIFO memories which store the variable length coding data and output or update the variable length coding data on the basis of a codeword length of the variable length coding data, a FIFO input selecting unit which outputs the variable length coding data to one of the plurality of FIFO memories, a variable length coding table storing unit which stores a variable length coding table representing a relationship between the variable length coding data, the codeword length and a decoding value, reads the variable length coding data stored in one of the plurality of FIFO memories, and compares the read variable length coding data with the variable length coding table, a table selecting unit which determines the codeword length and the decoding value on the basis of a comparison result of the variable length coding table storing unit, and outputs the determined codeword length to one of the plurality of FIFO memories, and a control unit which selects one of the plurality of FIFO memories as a destination FIFO memory, reads the variable length coding data from the input unit or one of the unselected FIFO memories, and controls the FIFO input selecting unit such that the read variable length coding data is output to the selected FIFO memory.

19 Claims, 10 Drawing Sheets

U.S. PATENT DOCUMENTS

| | | |
|---|---|---|
| 6,433,709 B1 | 8/2002 | Oue |
| 6,934,338 B1 | 8/2005 | Bublil et al. |
| 7,102,550 B1 | 9/2006 | Watanabe et al. |
| 7,180,901 B2 * | 2/2007 | Chang et al. ........... 370/395.64 |
| 2006/0126743 A1 | 6/2006 | Takekawa et al. |
| 2008/0010439 A1 * | 1/2008 | Stein et al. .................. 712/210 |

* cited by examiner

(A) VLC TABLE 511

| INPUT | OUTPUT | |
|---|---|---|
| CORDWORD | L | D |
| 00 | 2bit | 0 |
| 01 | 2bit | 6 |
| 100 | 3bit | 2 |
| 101 | 3bit | 3 |
| 11000 | 5bit | 1 |
| 11001 | 5bit | 15 |
| 11010 | 5bit | 11 |
| 11011 | 5bit | 4 |

(B) VLC TABLE 512

| INPUT | OUTPUT | |
|---|---|---|
| CORDWORD | L | D |
| 00 | 2bit | 0 |
| 01 | 2bit | 1 |
| 100 | 3bit | 2 |
| 101 | 3bit | 3 |
| 11000 | 5bit | 4 |
| 11001 | 5bit | 5 |
| 11010 | 5bit | 6 |
| 11011 | 5bit | 7 |

(C) COMPARISION RESULT

| SEL | OUTPUT | |
|---|---|---|
| | L | D |
| 511 | 2bit | 6 |
| 512 | 2bit | 1 |

VARIABLE LENGTH CODE DECODING APPARATUS AND VARIABLE LENGTH CODE DECODING METHOD

CROSS-REFERENCE TO RELATED APPLICATION

This application is based upon and claims the benefit of priority from the prior Japanese Patent Application No. 2007-29379, filed on 8, Feb., 2007; the entire contents of which are incorporated herein by reference.

BACKGROUND OF THE INVENTION

1. Field of the Invention

The present invention relates to a variable length code decoding apparatus and a variable length code decoding method and, more particular, a variable length code decoding apparatus and a variable length code decoding method to decode a code string coded by using a defined set of variable length codes.

2. Related Art

In a moving image compression coding scheme such as MPEG-2, H. 264 or VC-1, compression coding is performed by using a defined set of variable length codes. Therefore, as one of basic constituent elements of a moving image decoding apparatus, a variable length code decoding apparatus is essential to decode a code string coded by using a defined set of variable length codes.

A conventional variable length code decoding apparatus uniquely determines a codeword length and a decoding value by using a variable length coding table (relationship between a bit string stored in a memory, a codeword and a decoding value) for a bit string stored in FIFO (First In First Out) memory. In this case, a load generated when a codeword length is output increases depending on the number of variable length coding tables. In particular, when the VC-1 scheme is used, the number of variable length coding tables is larger than that of the MPEG-2 scheme.

In contrast to this, in general, it is known that a plurality of memories each having the same storage content are arranged, and respective output destinations are distributed to distribute loads, so that a processing speed can be increased.

However, even though the method is simply applied to a FIFO memory of a variable length code decoding apparatus, the effectiveness of the increase in processing speed by distributing loads is disadvantageously reduced. The reason is because bit strings output from a plurality of FIFO memories return to the FIFO memories as codeword lengths through a variable length coding table. More specifically, even though loads generated on the variable length coding table is distributed by arranging the plurality of FIFO memories, increase in the number of FIFO memories (destinations of codewords output from the variable length coding table) causes increase of a load generated when the codeword lengths are output (Japanese Patent application (laid-Open) No. 8-205142).

SUMMARY

According to a first aspect of the present invention, there is provided a variable length code decoding apparatus comprising:

an input unit which receives variable length coding data;

a plurality of FIFO memories which store the variable length coding data and output or update the variable length coding data on the basis of a codeword length of the variable length coding data;

a FIFO input selecting unit which outputs the variable length coding data to one of the plurality of FIFO memories;

a variable length coding table storing unit which stores variable length coding tables representing relationships between the variable length coding data, a codeword length and a decoding value, reads the variable length coding data stored in one of the plurality of FIFO memories, and compares the read variable length coding data with the variable length coding table;

a table selecting unit which determines the codeword length and the decoding value on the basis of a comparison result of the variable length coding table storing unit, and outputs the determined codeword length to one of the plurality of FIFO memories; and a control unit which selects one of the plurality of FIFO memories as a destination FIFO memory, reads the variable length coding data from the input unit or one of the unselected FIFO memories, and controls the FIFO input selecting unit such that the read variable length coding data is output to the selected FIFO memory.

According to a second aspect of the present invention, there is provided a variable length code decoding apparatus comprising:

an input unit which receives variable length coding data;

a first FIFO memory and a second FIFO memory which store the variable length coding data and output or update the variable length coding data on the basis of a codeword length of the variable length coding data;

a FIFO input selecting unit which outputs the variable length coding data to the first FIFO memory or the second FIFO memory;

a first variable length coding table storing unit and a second variable length coding table storing unit which are connected to the first FIFO memory or the second FIFO memory, store variable length coding tables representing relationships between the variable length coding data, the codeword length and a decoding value, reads the variable length coding data stored in the first FIFO memory or the second FIFO memory, and compare the read variable length coding data with the variable length coding table;

a first table selecting unit and a second table selecting unit which are connected to the first FIFO memory or the second FIFO memory and the first variable length coding table storing unit or the second variable length coding table storing unit, determine the codeword length and the decoding value on the basis of a comparison result of the first variable length coding table storing unit and the second variable length coding table storing unit, and output the determined codeword length to the first FIFO memory or the second FIFO memory; and a control unit which selects one of the first FIFO memory as a destination FIFO memory, reads the variable length coding data from the input unit or the second FIFO memory, and controls the FIFO input selecting unit such that the read variable length coding data is output to the first FIFO memory.

According to a third aspect of the present invention, there is provided a variable length code decoding method comprising:

inputting variable length coding data;

outputting the variable length coding data to one of a plurality of FIFO memories;

reading the variable length coding data stored in one of the plurality of FIFO memories, and comparing the read variable length coding data with a variable length coding table;

determining a codeword length and a decoding value on the basis of a comparison result, and outputting the determined codeword length to one of the plurality of FIFO memories; and selecting one of the plurality of FIFO memories as a destination FIFO memory, reading the input variable length coding data or the variable length coding data from one of the unselected FIFO memories, and outputting the read variable length coding data to the selected FIFO memory.

BRIEF DESCRIPTION OF THE DRAWINGS

FIG. 10 is an example of variable length code tables and a comparison result.

DETAILED DESCRIPTION

An embodiment of the present invention will be described below with reference to the accompanying drawings. The embodiment (this will be described later) is merely an embodiment of the present invention, and does not limit the spirit and scope of the invention.

Figure 1:
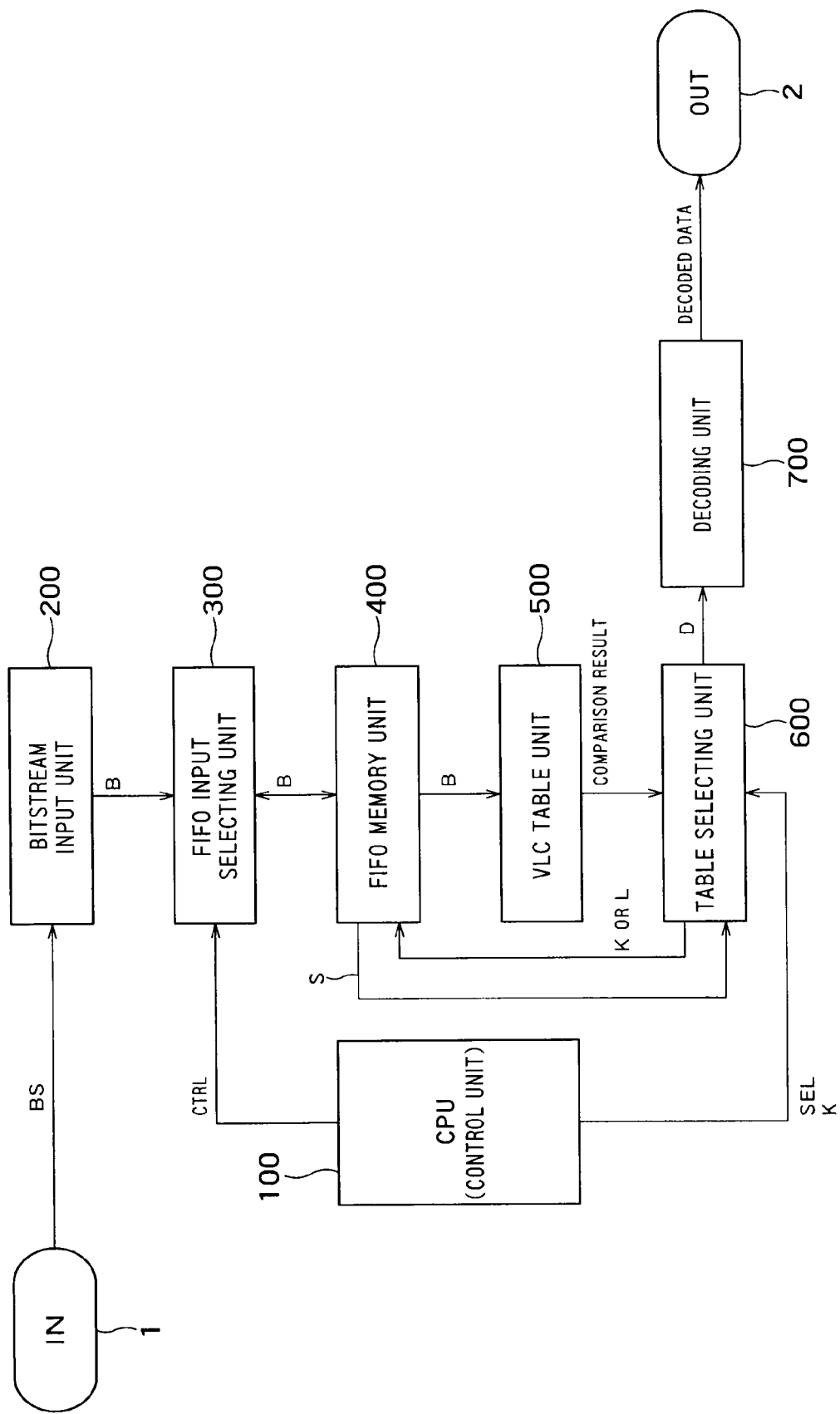
FIG. 1 is a block diagram showing a configuration of a variable length code decoding apparatus according to an embodiment of the present invention.

FIG. 1 is a block diagram showing a configuration of a variable length code decoding apparatus according to an embodiment of the present invention.

The variable length code decoding apparatus includes an input terminal (IN) 1, an output terminal (OUT) 2, a CPU (control unit) 100, a bitstream input unit 200, a FIFO input selecting unit 300, a FIFO memory unit 400, a variable length coding table unit 500, a table selecting unit 600, and a decoding unit 700.

The CPU (control unit) 100 outputs a control signal (CTRL) to the FIFO input selecting unit 300, and outputs a table selection signal (SEL) and a constant (K=0 or 32) to the table selecting unit 600.

The bitstream input unit 200 inputs a bitstream (BS) (see FIG. 3(e)) through the input terminal (IN) 1, and outputs the bitstream to the FIFO input selecting unit 300 in units of predetermined bit strings (B) (for example, 32 bits).

The FIFO input selecting unit 300 selects any one of the bit strings (B) output from the bitstream input unit 200 or the FIFO memory unit 400 on the basis of the control signal (CTRL) output from the CPU (control unit) 100, and outputs the bit string (B) to the FIFO memory unit 400.

The FIFO memory unit 400 stores the bit string (B) output from the FIFO input selecting unit 300 and outputs the bit string (B) to the variable length coding table unit 500 by a first in first out scheme. The output bit string (B) is a 32-bit bit string having a present decoding position on a bitstream (BS) as a start. The FIFO memory unit 400 outputs a shift control signal (S) to the table selecting unit 600.

The variable length coding table unit 500 stores variable length coding tables (see FIGS. 10(A) and 10(B)) in advance, compares the bit string (B) output from the FIFO memory unit 400 with the variable length coding tables, and outputs comparison results to the table selecting unit 600.

The table selecting unit 600 selects one of comparison results (codeword length (L) and decoding value (D)) output from the variable length coding table unit 500 on the basis of the table selection signal output from the CPU (control unit) 100, outputs the codeword length (L) to the FIFO memory unit 400, and outputs the decoding value (D) to the decoding unit 700. The table selecting unit 600 outputs a constant (K) output from the CPU (control unit) 100 to the FIFO memory unit 400.

The decoding unit 700 performs a predetermined decoding process to the decoding value (D) output from the table selecting unit 600 and outputs the decoded data to the output terminal (OUT) 2. An explanation of the predetermined decoding process will be omitted.

Figure 2:
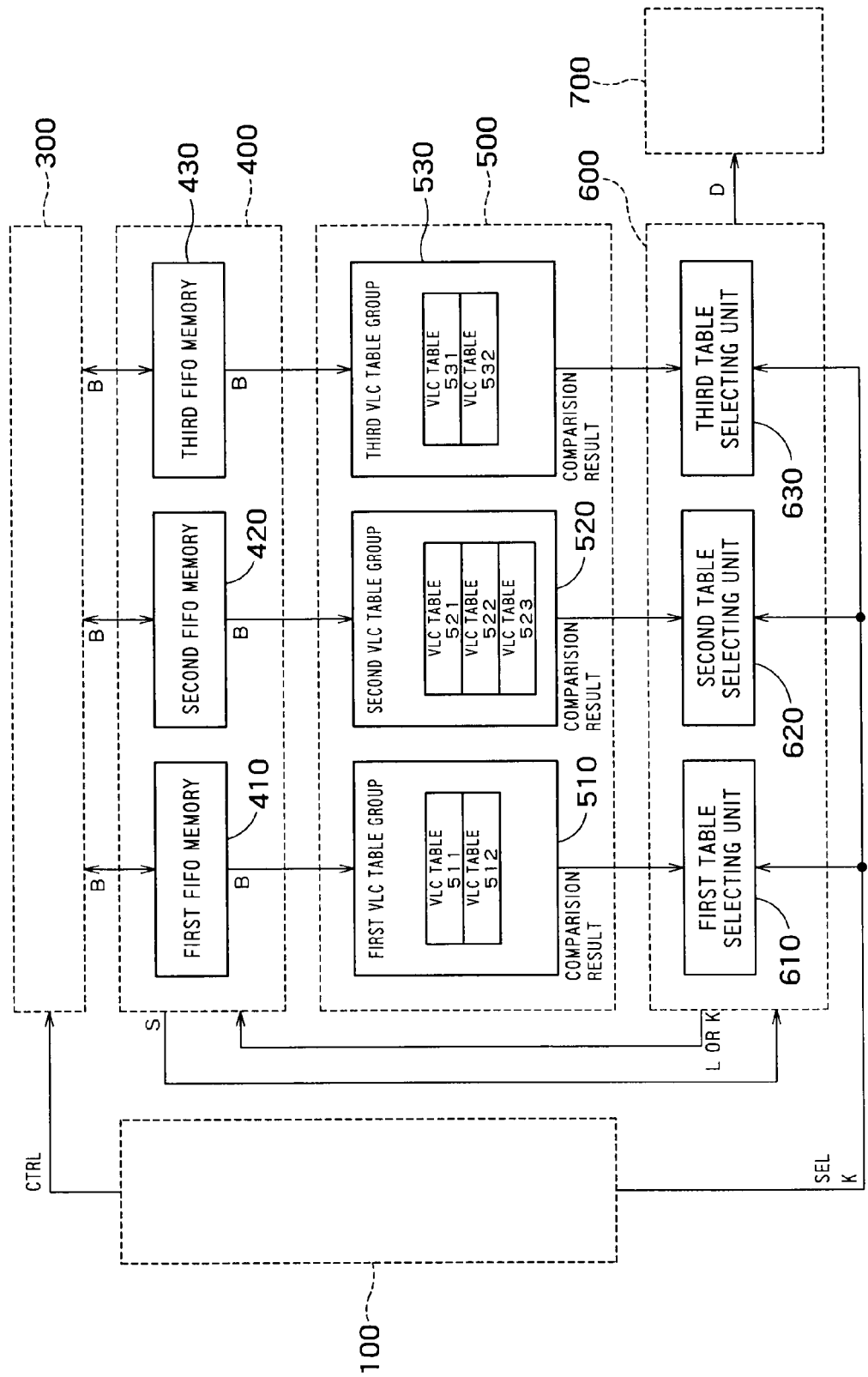
FIG. 2 is a block diagram showing configurations of the FIFO memory unit 400, the variable length coding table unit 500, and the table selecting unit 600 according to the embodiment of the present invention.

FIG. 2 is a block diagram showing configurations of the FIFO memory unit 400, the variable length coding table unit 500, and the table selecting unit 600 according to the embodiment of the present invention.

The FIFO memory unit 400 includes a first FIFO memory 410 to a third FIFO memory 430 which can be selectively used depending on pieces of position information. The first FIFO memory 410 is used to decode picture information (see FIG. 3(B)) of a bitstream (BS), the second FIFO memory 420 is used to decode macroblock (MB) information (FIG. 3(D)) of a bitstream (BS), and the third FIFO memory 430 is used to decode block (BLK) information of the bitstream (BS). The first FIFO memory 410 to the third FIFO memory 430 store the bit strings (B) output from the FIFO input selecting unit 300 in 32-bit units, and output the bit string (B) to the variable length coding table unit 500.

The variable length coding table unit 500 includes a first variable length coding table group 510 to a third variable length coding table group 530 which are arranged to correspond to the first FIFO memory 410 to the third FIFO memory 430, respectively. The first variable length coding table group 510 stores picture and slice variable length coding tables 511 and 512, the second variable length coding table group 520 store macroblock (MB) variable length coding tables 521 to 523, and the third variable length coding table group 530 stores block (BLK) variable length coding tables 531 and 532. The first variable length coding table group 510 to the third variable length coding table group 530 compare bit strings (B) output from the FIFO memory unit 400 with the variable length coding tables 511 to 532, and output comparison results to the table selecting unit 600.

For example, when the bit string (B) is output to the first variable length coding table group 510, comparison results corresponding to the variable length coding tables 511 and 512 (more specifically, comparison results of two types) are output.

FIGS. 10(A) and 10(B) show examples of the variable length coding tables 511 and 512. The variable length coding table is information representing relationships between codewords which do not overlap each other on a binary tree and corresponding codeword lengths (L) and decoding values (D).

For example, when a codeword of a bit string output from the first FIFO memory 410 is "01", the comparison result of the variable length coding table 511 is a codeword length (L=2 bits) and a decoding value (D=6), and the comparison result of the variable length coding table 512 is a codeword length (L=2 bits) and a decoding value (D=1) (see FIG. 10(C)).

The table selecting unit 600 includes a first table selecting unit 610 to a third table selecting unit 630 arranged to correspond to the first variable length coding table group 510 to the third variable length coding table group 530, respectively. The first table selecting unit 610 to the third table selecting unit 630 uniquely determine comparison results output from the variable length coding table unit 500 on the basis of a table selection signal (SEL) output from the CPU (control unit) 100, output codeword lengths (L) to the FIFO memory unit 400, and output decoding values (D) to the decoding unit 700. The first table selecting unit 610 to the third table selecting unit 630 output constant (K) output from the CPU (control unit) 100 to the FIFO memory unit 400.

For example, when a comparison result as shown in FIG. 10(C) is output from the variable length coding table unit 500 and selection signal "SEL=512" is output from the CPU (control unit) 100, the first table selecting unit 610 outputs a codeword length "L=2" to the first FIFO memory 410, and outputs decoding value "D=1" to the decoding unit 700.

Figure 3:
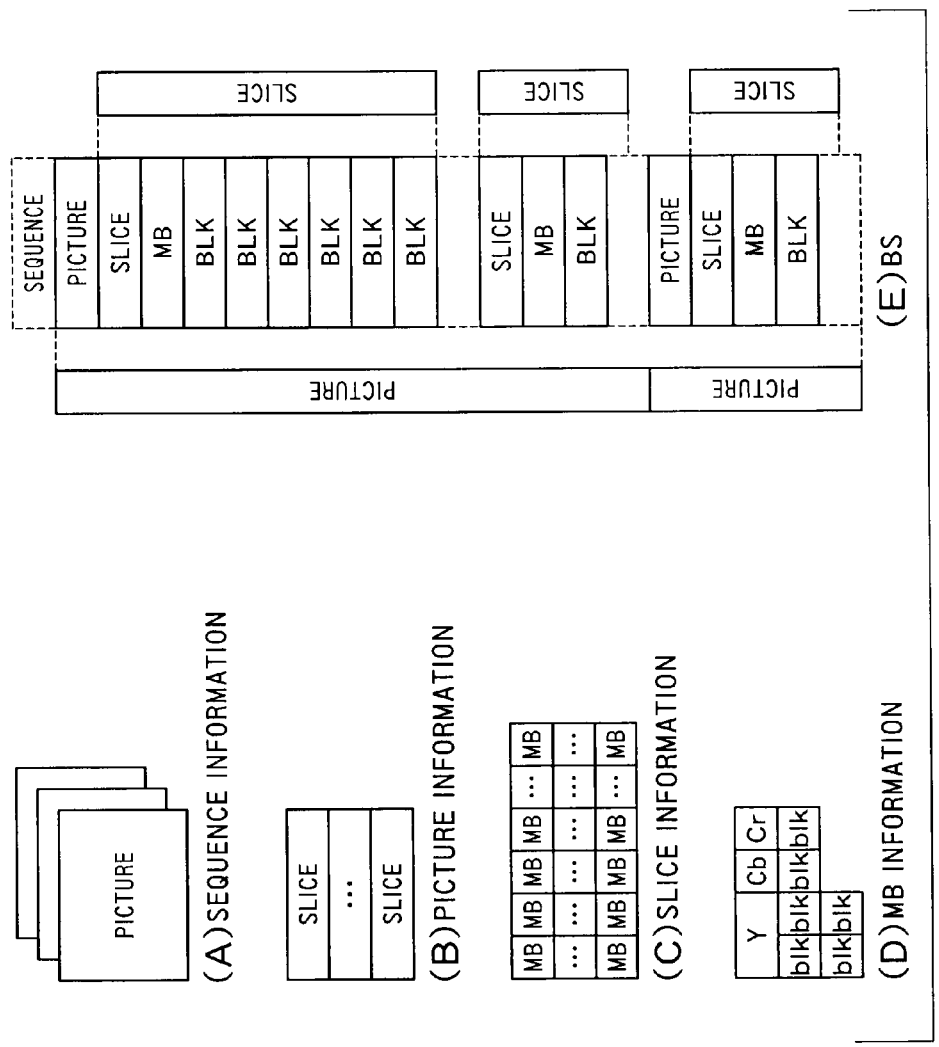
FIG. 3 is an example of a data structure of a bitstream (BS) according to the embodiment.

FIG. 3 is an example of a data structure of a bitstream (BS) according to the embodiment.

The bitstream (BS) includes sequence information, picture information, slice information, macroblock (MB) information and block (BLK) information. FIG. 3(A) shows an example of the sequence information. The sequence information includes a plurality of pieces of picture information. FIG. 3(B) shows an example of the picture information. The picture information includes a plurality of pieces of slice information. FIG. 3(C) shows an example of the slice information. The slice information includes a plurality of pieces of macroblock (MB) information divided into pieces of information each having a predetermined size. In FIG. 3(D), the macroblock (MB) information includes four Y blocks, one Cb block and one Cr block.

FIG. 3(E) shows a data structure of an entire bitstream according to the embodiment of the present invention. The bitstream according to the embodiment of the present invention includes a plurality of pieces of picture information subsequent to the sequence information serving as header information. As described above, one piece of picture information includes a plurality of slice information, one piece of slice information includes a plurality of pieces of macroblock (MB) information, and one macroblock (MB) information includes six pieces of block (BLK) information.

Figure 4:
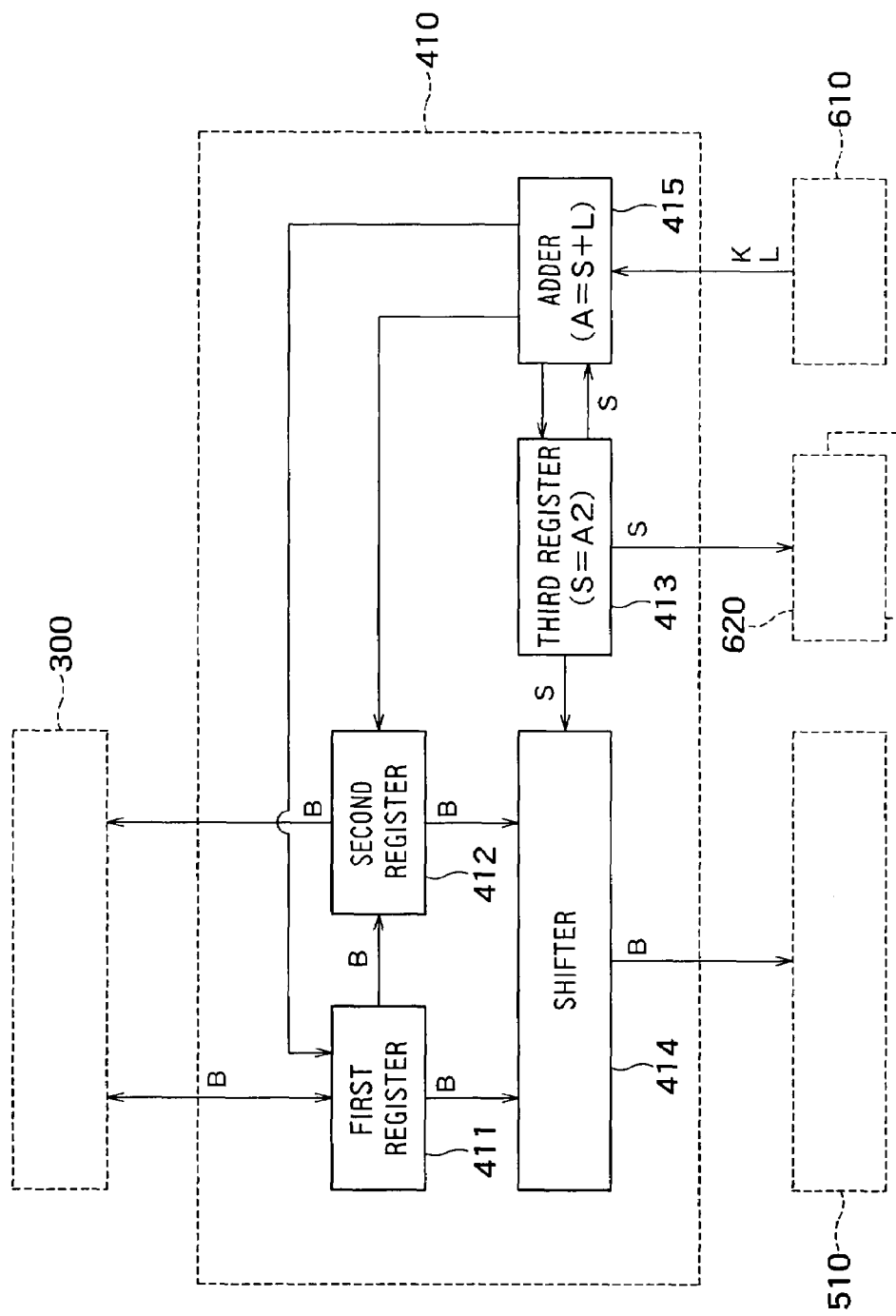
FIG. 4 is a block diagram showing a configuration of the first FIFO memory 410 according to the embodiment of the present invention.

FIG. 4 is a block diagram showing a configuration of the first FIFO memory 410 according to the embodiment of the present invention. The second FIFO memory 420 and the third FIFO memory 430 have the same configuration as that of the first FIFO memory 410.

The first FIFO memory 410 includes a first register 411, a second register 412, a third register 413, a shifter 414 and an adder 415. The shifter 414 and the adder 415 are realized by a combinational circuit and form a synchronous sequential circuit.

The first register 411 stores the 32-bit bit string (B) output from the FIFO input selecting unit 300, and outputs the bit string (B) to the FIFO input selecting unit 300, the second register 412 and the shifter 414 at the basis of the update control signal (described later). More specifically, the first register 411 is a register to store and update the 32-bit bit string (B) output from the FIFO input selecting unit 300.

The second register 412 stores the 32-bit bit string (B) output from the first register 411, and outputs the 32-bit bit string (B) to the FIFO input selecting unit 300 and the shifter 414 at the basis of the update control signal. More specifically, the second register 412 is a register to store and update the 32-bit bit string (B) output from the first register 411.

The third register 413 stores a low-order 5 bits (A2) of an addition result of the adder 415 (this will be described later) as a shift control signal (S), and outputs the low-order 5 bits to the shifter 414, the adder 415, the second table selecting unit 620 and the third table selecting unit 630.

The shifter 414 performs a shift process to update the 32-bit bit string (B) output from the first register 411 or the second register 412 on the basis of the 5-bit shift control signal (S) output from the third register 413, and outputs the 32-bit bit string (B) to the first variable length coding table group 510. The shift process can shift the 32-bit bit strings (values of total of 64 bits) of the first register 411 and the second register 412 by 32 bits at a maximum.

The adder 415 adds a 6-bit codeword length (L) output from the first table selecting unit 610 and a 5-bit shift control signal (S) output from the third register 413, outputs high-order 1 bit (A1) of the addition result to the first register 411 and the second register 412 as an updated control signal, and outputs low-order 5 bits (A2) of the addition result to the third register 413 as an updated value. The adder 415 regards the constant (K) output from the first table selecting unit 610 as A, outputs the high-order 1 bit (A1) to the first register 411 and the second register 412, and outputs low-order 5 bits to the third register 413.

For example, when K=0, the FIFO memory unit 400 and the variable length coding table unit 500 do not operate. More specifically, the values of the first register 411 to the third register 413 are not updated. When K=32, a 32-bit bit string is output from the FIFO input selecting unit 300 to the FIFO memory unit 400.

Figure 5:
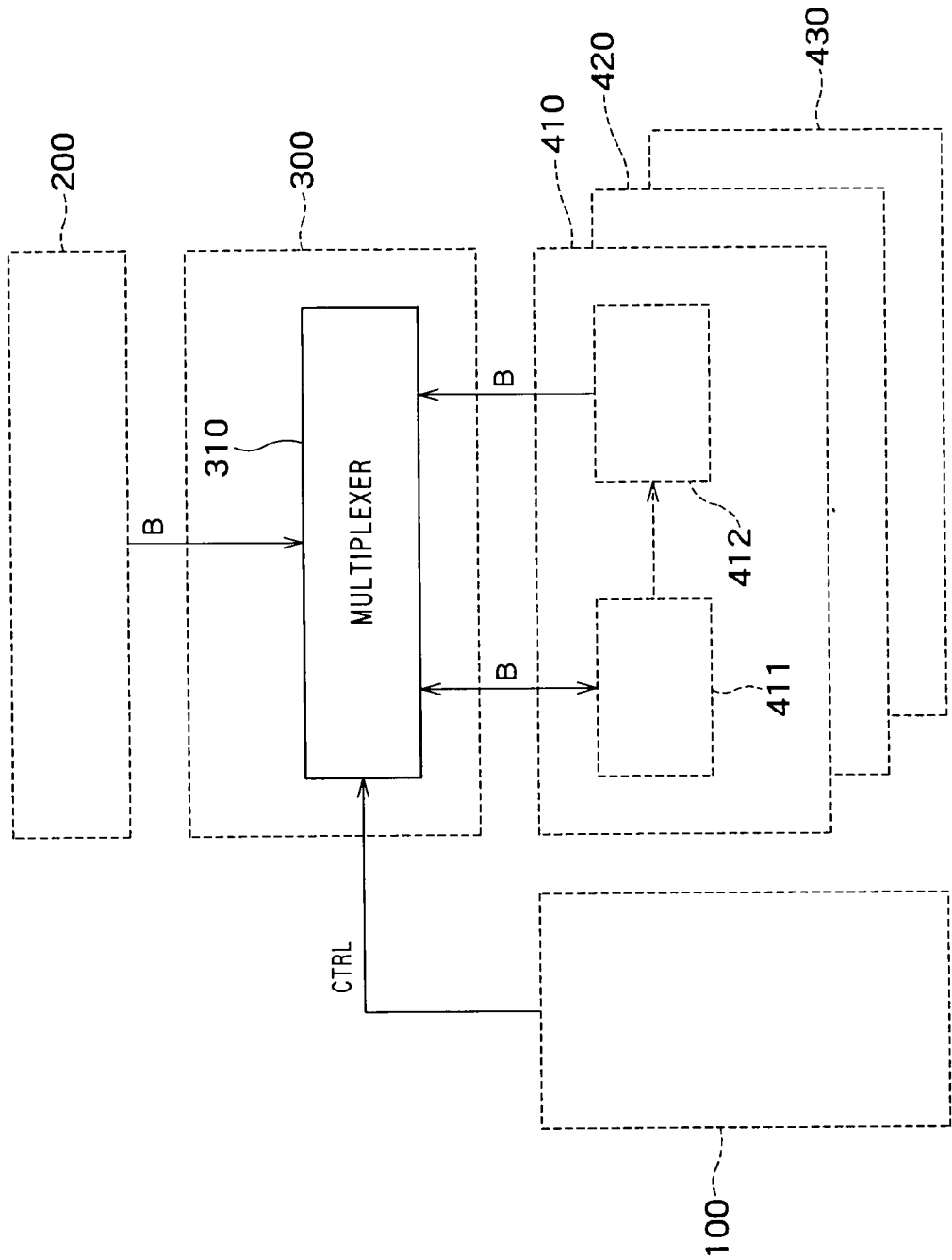
FIG. 5 is a block diagram showing a configuration of the FIFO input selecting unit 300 according to the embodiment of the present invention.

FIG. 5 is a block diagram showing a configuration of the FIFO input selecting unit 300 according to the embodiment of the present invention.

The FIFO input selecting unit 300 includes a multiplexer 310. The multiplexer 310 selects one of the bitstream input unit 200 or the FIFO memory unit 400 (for example, the first register 411 or the second register 412 of the first FIFO memory 410) on the basis of the control signal (CTRL) output from the CPU (control unit) 100, and outputs a bit string to the FIFO memory unit 400 (for example, the first register 411 of the first FIFO memory 410). The FIFO input selecting unit 300 selects any one of the first FIFO memory 410 to the third FIFO memory 430 as a destination FIFO memory with reference to the position information of the bit string.

For example, in a FIFO moving process (this will be described later) (see FIG. 9), the multiplexer 310 outputs the bit string output from the second FIFO memory 420 or the third FIFO memory 430 to the first register 411 of the first FIFO memory 410.

Figure 6:
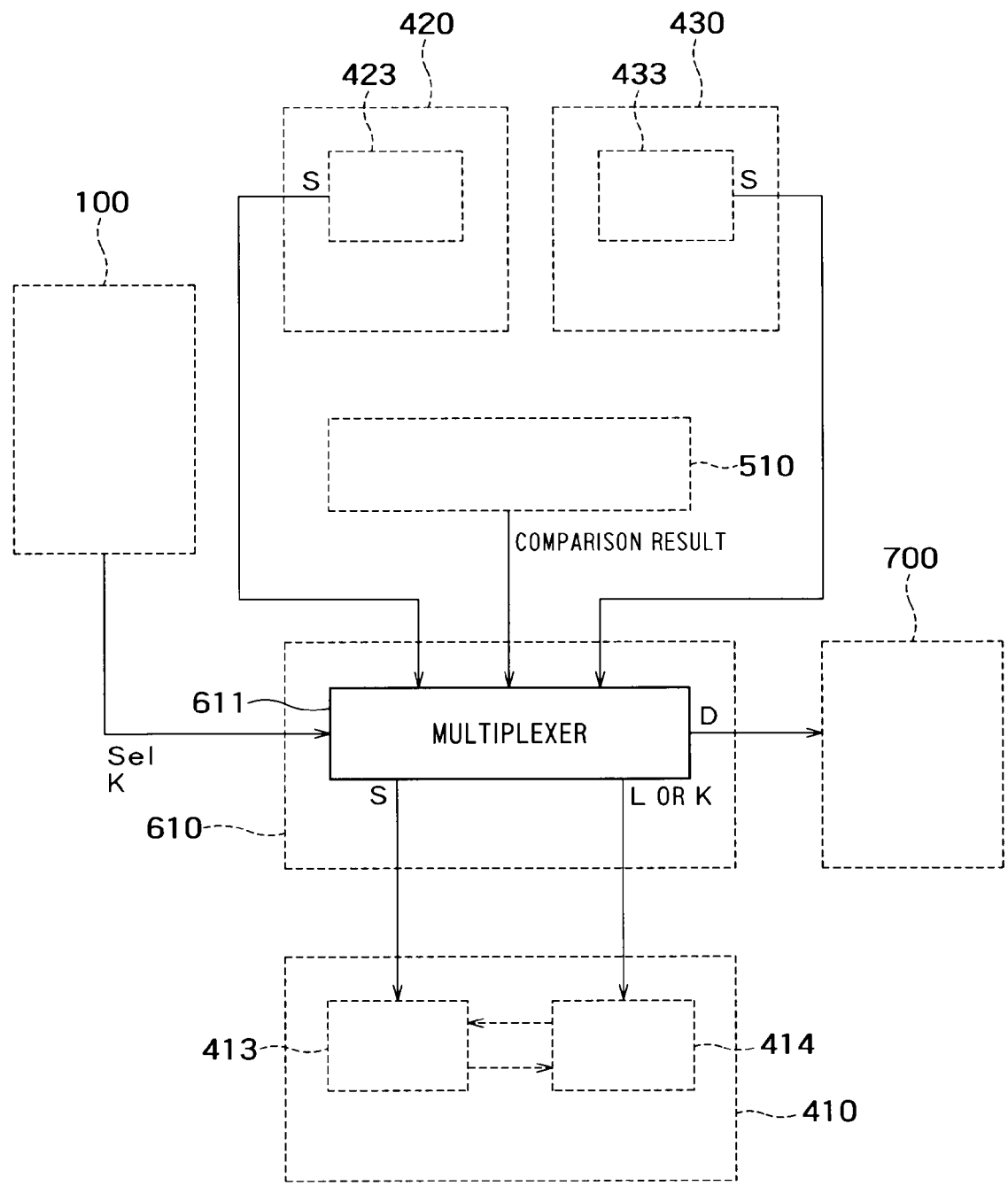
FIG. 6 is a block diagram showing a configuration of the first table selecting unit 610 according to the embodiment of the present invention.

FIG. 6 is a block diagram showing a configuration of the first table selecting unit 610 according to the embodiment of the present invention. The second table selecting unit 620 and the third table selecting unit 630 have the same configuration as that of the first table selecting unit 610.

The first table selecting unit 610 includes a multiplexer 611. The multiplexer 611 selects one of a plurality of comparison results output from the first variable length coding table group 510 on the basis of the table selection signal (SEL) output from the CPU (control unit) 100, outputs a codeword length (L) to the adder 414 of the first FIFO memory 410, and outputs a decoding value (D) to the decoding unit 700.

For example, in a FIFO moving process (this will be described later) (see FIG. 9), the multiplexer 611 outputs the shift control signal (S) output from the third register 423 of the second FIFO memory 420 or the third register 433 of the third FIFO memory 430 to the third register 413 of the first FIFO memory 410, and outputs the constant (K) output from the CPU (control unit) 100 to the adder 415 of the first FIFO memory 410.

Figure 7:
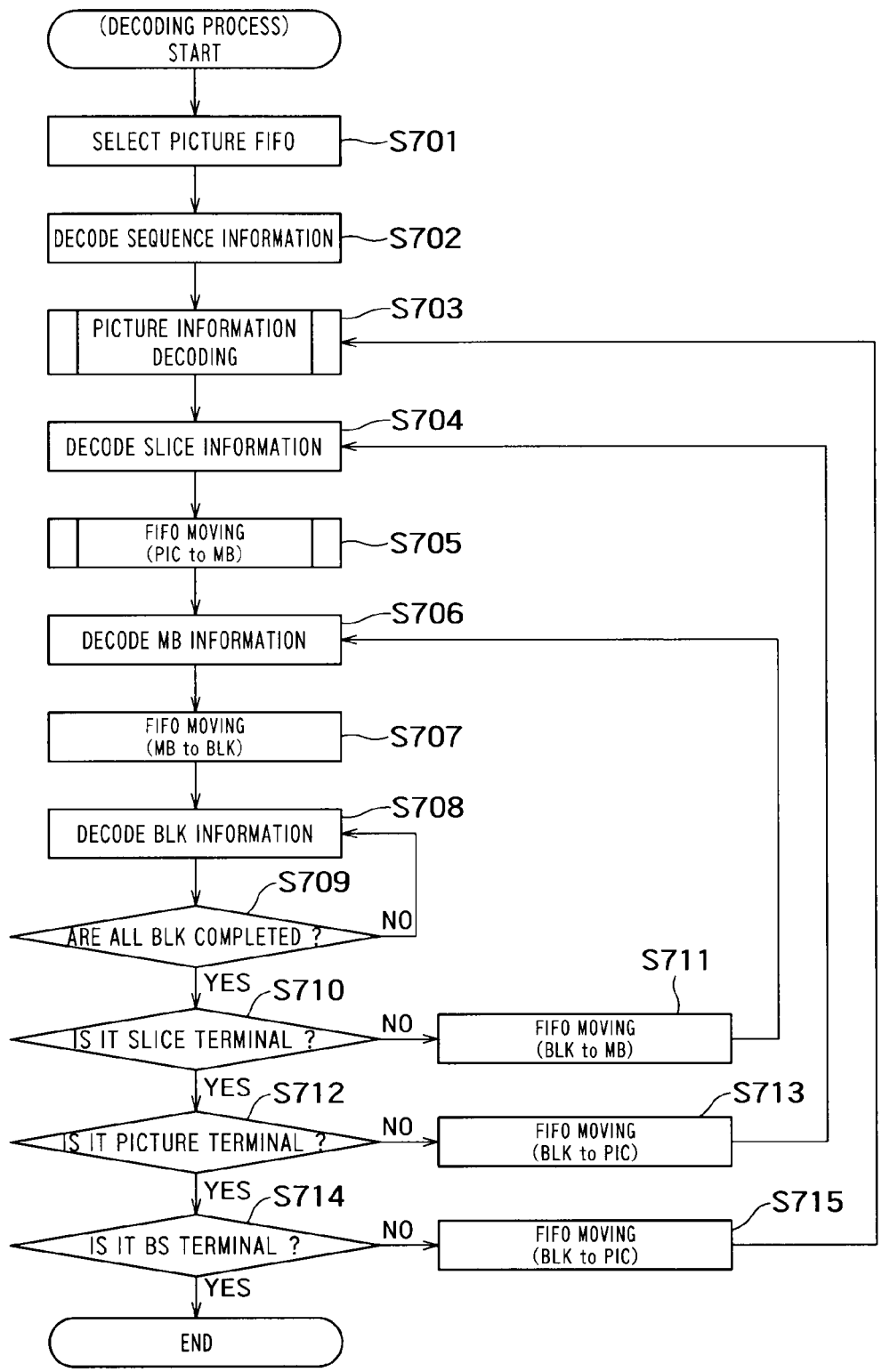
FIG. 7 is a flow chart showing a procedure of the CPU (control unit) 100 in a decoding process according to the embodiment of the present invention.

FIG. 7 is a flow chart showing a procedure of the CPU (control unit) 100 in a decoding process according to the embodiment of the present invention.

The CPU (control unit) 100, first, outputs a control signal (CTRL) to the FIFO input selecting unit 300, causes the FIFO input selecting unit 300 to select the first FIFO memory 410 as a destination FIFO memory on the basis of position information of the bit string (B), and outputs the constant (K) to the first table selecting unit 610 to store the bit string (B) in the first FIFO memory 410 (S701). At this time, the CPU (control unit) 100 outputs a constant (K=0) to the second table selecting unit 620 and the third table selecting unit 630 to prevent the second FIFO memory 420 and the third FIFO memory 430 from being operated.

Then, with respect to the bit string (B) stored in the first FIFO memory 410, a sequence information decoding process is performed (S702). Then, picture information (following sequence information decoded in S702) is decoded by using a picture and slice table (variable length coding table 511 and 512) stored in the first variable length coding table group 510 (S703). S703 this will be described later (see FIG. 8). Then, slice information (following picture information decoded in S703) is decoded by using the same table group 510 (S704).

Then, with reference to position information of the bit string (B) after the decoding in S704, a FIFO moving process (see FIG. 9) from the picture FIFO memory (the first FIFO memory 410) to the macroblock FIFO memory (the second FIFO memory 420) is performed (S705). Then, the macroblock (MB) information is decoded by using the macroblock table stored in the second variable length coding table group 520 (S706).

Then, with reference to position information of the bit string (B) after the decoding in S706, a FIFO moving process from the macroblock FIFO memory (the second FIFO memory 420) to the block FIFO memory (the third FIFO memory 430) is performed (S707). Then, block (BLK) information is decoded by using the block table stored in the third variable length coding table group 530 (S708).

When all the pieces of block (BLK) information are decoded (S709- Yes), it is determined whether decoding is performed up to the terminal of the slice information (S710). When the decoding is not performed up to the terminal of the slice information (S710- No), a FIFO moving process from the block FIFO memory (the third FIFO memory 430) to the macroblock FIFO memory (the second FIFO memory 420) (S711), and the operation of the CPU (control unit) 100 returns to S706.

On the other hand, the decoding is performed up to the terminal of the slice information (S710-Yes), it is determined whether decoding is performed up to the terminal of the picture information (S712). When the decoding is not performed up to the terminal of the picture information (S712-Yes), a FIFO moving process from the block FIFO memory (the third FIFO memory 430) to the picture FIFO memory (the first FIFO memory 410) is performed (S713), and the operation of the CPU (control unit) 100 returns to S704.

On the other hand, when the decoding is performed up to the terminal of the picture information (S712-Yes), it is determined whether decoding is performed up to the terminal of the whole bitstream (BS) (S714). When the decoding is not performed up to the terminal of the whole bitstream (BS) (S714-No), a FIFO moving process from the block FIFO memory (the third FIFO memory 430) to the picture FIFO memory (the first FIFO memory 410) is performed (S713), and the operation of the CPU (control unit) 100 returns to S703.

On the other hand, when the decoding is performed up to the terminal of the whole bitstream (BS) (S714-Yes), the decoding process is ended.

Figure 8:
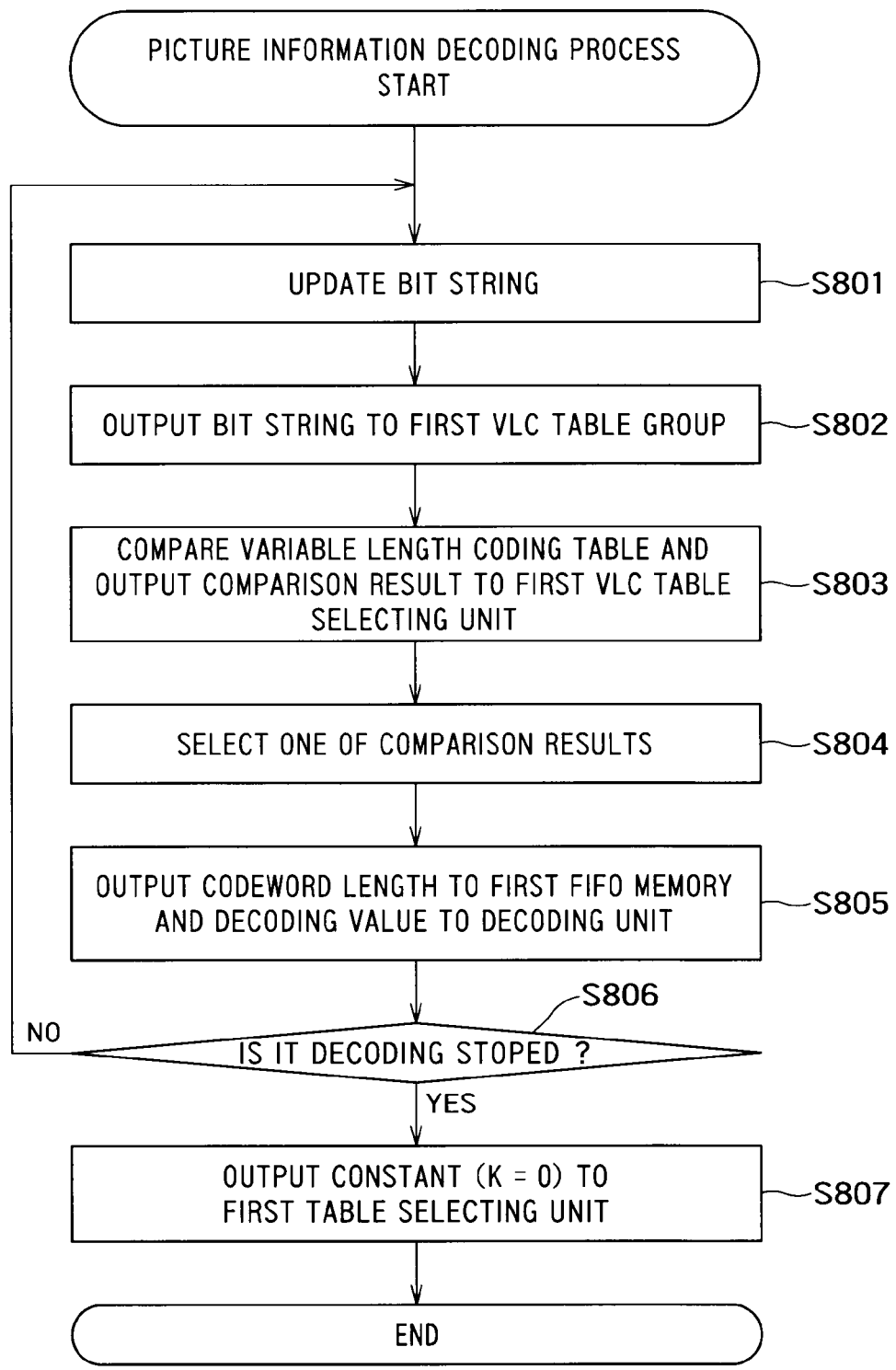
FIG. 8 is a flow chart showing a procedure of the CPU (control unit) 100 performed in a one-clock cycle in a picture information decoding process according to the embodiment of the present invention.

Steps S702, S704, S706 and S708 are performed like S703 (see FIG. 8). Steps S707, S711, S713 and S715 are performed like S705 (See FIG. 9).

FIG. 8 is a flow chart showing a procedure of the CPU (control unit) 100 performed in a one-clock cycle in a picture information decoding process according to the embodiment of the present invention. A decoding process for information other than picture information (for example, slice information decoding process, macroblock (MB) information decoding process and block (BLK) information decoding process, and alike) is performed by the same manner as described above.

The CPU (control unit) 100, first, updates the bit string (B) stored in the first FIFO memory 410 according to a value of the constant (K) or the codeword length (L) (S801). When the picture information decoding process is performed to the first bit string (B), the process is performed according to the value of the constant (K), and when the picture information decoding process is performed to the second and subsequent bit string (B), the process is performed according to the value of the codeword length (L).

Then, a bit string is output from the first FIFO memory 410 to the first variable length coding table group 510 (S802). Then, the comparison results of the bit string (B) to the variable length coding tables stored in the first variable length coding table group 510 is output to the first table selecting unit 610 (S803). Then, on the basis of the table selection signal (SEL), a codeword length (L) and a decoding value (D) are selected (S804). Then, the codeword length (L) is output to the first table selecting unit 610, and the decoding value (D) is output to the decoding unit 700 (S805).

Then, when the decoding process is not stopped (S806-No), the operation of the CPU (control unit) 100 returns to S801 to update the bit string (B) according to the codeword length (L) output in step S805 (S801). The processes in steps S801 to S805 are performed until the decoding is stopped. On the other hand, when the decoding process is stopped (S806-

Yes), a constant (K=0) is output to the first table selecting unit 610, and the picture information decoding process is ended (S807).

Figure 9:
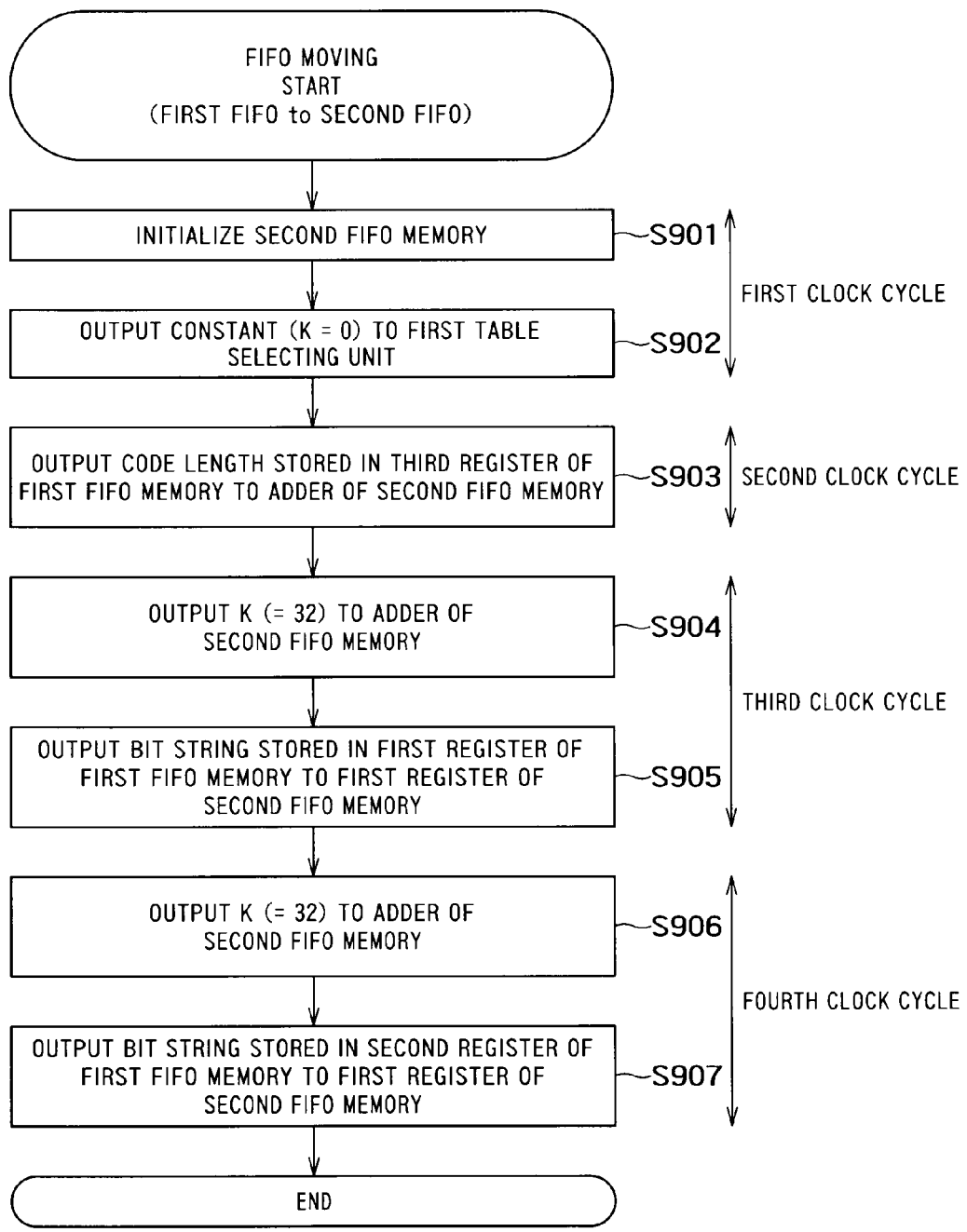
FIG. 9 is a flow chart showing a procedure of the CPU (control unit) 100 in a FIFO moving process according to the embodiment of the present invention.

FIG. 9 is a flow chart showing a procedure of the CPU (control unit) 100 in a FIFO moving process according to the embodiment of the present invention. FIG. 9 shows an example in which moving is performed from the first FIFO memory 410 to the second FIFO memory 420. In other cases, the same procedure as described below is performed.

The CPU (control unit) 100, first, initializes the second FIFO memory 420 to set the contents of a first register (not shown) to a third register 423 of the second FIFO memory 420 to 0 (S901). Subsequently, a constant (K=0) is output to the first table selecting unit 610 (S902). Steps S901 to S902 are performed within a first clock cycle.

Then, a predetermined table selection signal (SEL) is output to the second table selecting unit 620 to output the codeword length (L) stored in the third register 413 of the first FIFO memory 610 to the third register 423 of the second FIFO memory 420 (S903). Step S903 is performed within a second clock cycle. Upon completion of the second clock cycle, the contents of the third register 423 of the second FIFO memory 420 become equal to the contents of the third register 413 of the first FIFO memory 410.

Then, a constant (K=32) is output to the adder 425 of the second FIFO memory 420 through the second table selecting unit 620 (S904). Then, a control signal (CTRL) is output to the FIFO input selecting unit 300 to output the bit string (B) stored in the second register 412 of the first FIFO memory 410 to the first register (not shown) of the second FIFO memory 420 (S905). Steps S904 and S905 are performed within a third clock cycle. Upon completion of the third clock cycle, the contents of the first register (not shown) of the second FIFO memory 420 become equal to the contents of the second register 412 of the first FIFO memory 410. In step S904, since the constant (K=32) is stored in the third register 423 of the second FIFO memory 420, the bit string (B) stored in the first register (not shown) of the second FIFO memory 420 is output to the second register (not shown) of the second FIFO memory 420 at the forth clock cycle.

Then, a constant (K=32) is output to the adder 425 of the second FIFO memory 420 through the second table selecting unit 620 (S906). A control signal (CTRL) is output to the FIFO input selecting unit 300 to output the bit string (B) stored in the first register 411 of the first FIFO memory 410 to the first register (not shown) of the second FIFO memory 420 (S907). Steps S906 and S907 are performed within a fourth clock cycle. Upon completion of the fourth clock cycle, the contents of the first register and the second register (not shown) of the second FIFO memory 420 become equal to the contents of the first register 411 and the second register 412 of the first FIFO memory 410. In step S906, since the constant (K=32) is stored in the third register 423 of the second FIFO memory 420, the bit string (B) stored in the first register (not shown) of the second FIFO memory 420 is output to the second register (not shown) of the second FIFO memory 420 in a fifth clock cycle.

According to the embodiment of the present invention, as shown in FIG. 2, the variable length coding table groups 510 to 530 for respective applications are arranged, and paths on which the codeword lengths L or the constants K input from the FIFO memories 410 to 430 to the table selecting units 610 to 630 through the variable length coding table groups 510 to 530 are output to the FIFO memories 410 to 430 are present. The paths are also present as in a case in which a single FIFO memory is used, and are not added. In this manner, even though the number of variable length coding tables stored in the variable length coding table unit 500 is increased, a load on one FIFO memory can be reduced. For this reason, maximum propagation delay time of the variable length code decoding apparatus can be shortened. Consequently, a speed of an entire decoding process can be increased.

As shown in FIG. 9, in the FIFO moving process, data exchange is performed between the plurality of FIFO memories 410 to 430, the same bit string (B) need not be output to the plurality of FIFO memories when the variable length coding table groups 510 to 530 for respective applications are arranged. For this reason, operation power consumptions of the plurality of FIFO memories 410 to 430 can be reduced.

What is claimed is:

1. A variable length code decoding apparatus comprising:
   an input unit which receives variable length coding data;
   a plurality of FIFO memories which store the variable length coding data and output or update the variable length coding data on the basis of a codeword length of the variable length coding data;
   a FIFO input selecting unit which outputs the variable length coding data to one of the plurality of FIFO memories;
   a variable length coding table storing unit which stores a variable length coding table representing a relationship between the variable length coding data, the codeword length and a decoding value, reads the variable length coding data stored in one of the plurality of FIFO memories, and compares the read variable length coding data with the variable length coding table;
   a table selecting unit which determines the codeword length and the decoding value on the basis of a comparison result of the variable length coding table storing unit, and outputs the determined codeword length to one of the plurality of FIFO memories; and
   a control unit which selects one of the plurality of FIFO memories as a destination FIFO memory, reads the variable length coding data from the input unit or one of the unselected FIFO memories, and controls the FIFO input selecting unit such that the read variable length coding data is output to the selected FIFO memory.

2. The variable length code decoding apparatus according to claim 1, further comprising
   a decoding unit which decodes the determined decoding value, and wherein
   the control unit, when a decoding result of the decoding unit must be further decoded, reads the variable length coding data from one of the unselected FIFO memories, and controls the FIFO input selecting unit such that the variable length coding data is output to the selected FIFO memory.

3. The variable length code decoding apparatus according to claim 2, wherein
   the control unit reads the variable length coding data stored in one of the unselected FIFO memories and, when the variable length coding data is output to the selected FIFO memory, controls the table selecting unit such that a codeword length to output or update the variable length coding data is output to the selected FIFO memory.

4. The variable length code decoding apparatus according to claim 1, wherein
the variable length coding table storing unit is arranged for each of pieces of position information of the variable length coding data.

5. The variable length code decoding apparatus according to claim 4, wherein
the control unit selects one of the plurality of FIFO memories as the destination FIFO memory on the basis of the position information.

6. The variable length code decoding apparatus according to claim 1, wherein
the input unit which receives a bitstream of a moving image, and
the control unit reads the variable length coding data from one of the unselected FIFO memories upon completion of decoding of picture information and slice information of the bitstream input by the input unit, and controls the FIFO input selecting unit such that the variable length coding data is output to the selected FIFO memory.

7. The variable length code decoding apparatus according to claim 6, wherein
the control unit reads the variable length coding data from one of the unselected FIFO memories upon completion of decoding of macroblock information of the bitstream input by the input unit, and controls the FIFO input selecting unit such that the variable length coding data is output to the selected FIFO memory.

8. A variable length code decoding apparatus comprising:
an input unit which receives variable length coding data;
a first FIFO memory and a second FIFO memory which store the variable length coding data and output or update the variable length coding data on the basis of a codeword length of the variable length coding data;
a FIFO input selecting unit which outputs the variable length coding data to the first FIFO memory or the second FIFO memory;
a first variable length coding table storing unit and a second variable length coding table storing unit which are connected to the first FIFO memory or the second FIFO memory, store variable length coding tables representing relationships between the variable length coding data, the codeword length and a decoding value, reads the variable length coding data stored in the first FIFO memory or the second FIFO memory, and compare the read variable length coding data with the variable length coding table;
a first table selecting unit and a second table selecting unit which are connected to the first FIFO memory or the second FIFO memory and the first variable length coding table storing unit or the second variable length coding table storing unit, determine the codeword length and the decoding value on the basis of a comparison result of the first variable length coding table storing unit and the second variable length coding table storing unit, and output the determined codeword length to the first FIFO memory or the second FIFO memory; and
a control unit which selects one of the first FIFO memory as a destination FIFO memory, reads the variable length coding data from the input unit or the second FIFO memory, and controls the FIFO input selecting unit such that the read variable length coding data is output to the first FIFO memory.

9. The variable length code decoding apparatus according to claim 8, comprising a decoding unit which is connected to the first table selecting unit and the second table selecting unit and decodes the determined decoding value, and wherein
the control unit reads the variable length coding data stored in the first FIFO memory when a decoding result of the decoding unit must be further decoded, and controls the FIFO input selecting unit such that the variable length coding data is output to the second FIFO memory.

10. The variable length code decoding apparatus according to claim 9, wherein
the control unit reads the variable length coding data stored in the first FIFO memory, and controls the second table selecting unit such that a codeword length to output or update the variable length coding data is output to the second FIFO memory when the variable length coding data is output to the second FIFO memory.

11. The variable length code decoding apparatus according to claim 10, wherein
the first variable length coding table storing unit and the second variable length coding table storing unit are arranged for each of pieces of position information of the variable length coding data.

12. The variable length code decoding apparatus according to claim 11, wherein
the control unit selects the first FIFO memory or the second FIFO memory as the destination FIFO memory on the basis of the position information.

13. The variable length code decoding apparatus according to claim 9, wherein
the first variable length coding table storing unit and the second variable length coding table storing unit are arranged for each of pieces of position information of the variable length coding data.

14. The variable length code decoding apparatus according to claim 13, wherein
the control unit selects the first FIFO memory or the second FIFO memory as the destination FIFO memory on the basis of the position information.

15. The variable length code decoding apparatus according to claim 8, wherein
the first variable length coding table storing unit and the second variable length coding table storing unit are arranged for each of pieces of position information of the variable length coding data.

16. The variable length code decoding apparatus according to claim 15, wherein
the control unit selects the first FIFO memory or the second FIFO memory as the destination FIFO memory on the basis of the position information.

17. The variable length code decoding apparatus according to claim 8, wherein
the input unit which receives a bitstream of a moving image, and
the control unit reads the variable length coding data from one of the unselected FIFO memories upon completion of decoding of picture information and slice information of the bitstream input by the input unit, and controls the FIFO input selecting unit such that the variable length coding data is output to the selected FIFO memory.

18. The variable length code decoding apparatus according to claim 17, wherein
the control unit reads the variable length coding data from one of the unselected FIFO memories upon completion of decoding of macroblock information of the bitstream input by the input unit, and controls the FIFO input selecting unit such that the variable length coding data is output to the selected FIFO memory.

19. A variable length code decoding method comprising:

inputting variable length coding data;

outputting the variable length coding data to one of a plurality of FIFO memories;

reading the variable length coding data stored in one of the plurality of FIFO memories, and comparing the read variable length coding data with a variable length coding table;

determining a codeword length and a decoding value on the basis of a comparison result, and outputting the determined codeword length to one of the plurality of FIFO memories;

selecting one of the plurality of FIFO memories as a destination FIFO memory, reading the input variable length coding data or the variable length coding data from one of the unselected FIFO memories, and outputting the read variable length coding data to the selected FIFO memory; and decoding the determined decoding value, wherein when the decoding result must be further decoded, the variable length coding data is read from one of the unselected FIFO memories and output to the selected FIFO memory.

* * * * *